United States Patent [19]
Fujii et al.

[11] Patent Number: 5,601,903
[45] Date of Patent: Feb. 11, 1997

[54] ORGANIC ELECTROLUMINESCENT ELEMENTS

[75] Inventors: Takanori Fujii; Takeshi Sano; Masayuki Fujita; Yuji Hamada, all of Osaka; Kenichi Shibata, Wakayama, all of Japan

[73] Assignee: Sanyo Electric Co., Ltd., Osaka, Japan

[21] Appl. No.: 295,548

[22] Filed: Aug. 25, 1994

[30] Foreign Application Priority Data

Aug. 27, 1993 [JP] Japan ..................... 5-213168

[51] Int. Cl.$^6$ .................. B32B 7/02; H05B 33/02
[52] U.S. Cl. .................. 428/212; 428/690; 428/917; 428/457; 313/504; 313/506
[58] Field of Search ................... 428/457, 689, 428/690, 704, 917, 212; 313/502, 504, 506

[56] References Cited

U.S. PATENT DOCUMENTS

| | | | |
|---|---|---|---|
| 4,769,292 | 9/1988 | Tang et al. | 428/690 |
| 5,093,698 | 3/1992 | Egusa | 357/17 |
| 5,281,489 | 1/1994 | Mori et al. | 428/690 |
| 5,343,050 | 8/1994 | Egusa et al. | 257/40 |
| 5,405,709 | 4/1995 | Littman et al. | 428/690 |

OTHER PUBLICATIONS

"Mechanism of Degradation of EL for Organic EL Device", T. Mori et al., The 50th Applied Physics Lecture at Nagoya University, Fall 1989, 29p–ZP–7 (with translation).

*Primary Examiner*—Patrick Ryan
*Assistant Examiner*—Marie R. Yamnitzky
*Attorney, Agent, or Firm*—Merchant, Gould, Smith, Edell, Welter & Schmidt, P.A.

[57] ABSTRACT

An organic EL element that exhibits excellent durability by reducing the amount of accumulated carriers and curbing degradation by heat generated while the organic EL element is driven. The organic EL element comprises a pair of a hole injecting electrode and an electron injecting electrode sandwiching an organic luminous layer and an organic carrier transport layer placed one on top of the other to have a boundary therebetween, characterized in that either the organic luminous layer or the organic carrier transport layer, whichever is placed closer to the hole injecting electrode, is doped with a first organic material, the first organic material being made of at least one substance, a minimum level of a conducting band of the first organic material being lower than a minimum level of a conducting band of a material forming the layer to be doped with the first organic material, and the other layer which is placed closer to the electron injecting electrode is doped with a second organic material, the second organic material being made of at least one substance, a maximum level of a valence band of the second organic material being higher than a maximum level of a valence band of the other layer to be doped with the second organic material.

14 Claims, 3 Drawing Sheets

ORGANIC ELECTROLUMINESCENT ELEMENTS

BACKGROUND OF THE INVENTION (1) Field of the Invention

The present invention relates to organic EL (electroluminescent) elements.

(2) Description of the Related Art

With rapid advancement of recent data processing units, considerable attention has been paid to EL elements to meet the increasing need for flat-display elements that consume less electricity and require less space compared with a CRT (cathode-ray-tube).

The EL elements include non-organic EL elements and organic EL elements. The non-organic EL elements emit light, or luminesce, when fully accelerated electrons collide with luminous materials to excite the same. On the other hand, the organic EL elements luminesce when electrons and holes, which are injected from an electron injecting electrode (cathode) and a hole injecting electrode (anode) respectively, re-combine in a luminous layer. The organic EL elements are advantageous over the non-organic EL elements in that they demand a lower driving voltage: the former demand about 5–20 V while the latter demand about 100–200 V. Moreover, the organic EL elements can luminesce three primary colors when they are made of adequate fluorescent materials, and thus are expected to enable a full-color display unit.

For further understanding, the structure of the organic EL elements will be explained more in detail.

The typical organic EL elements are either a three-layer or two-layer structure comprising an organic luminous layer and an organic carrier (electrons or holes) transport layer.

The three-layer structure known as a DH (Double Hetero) structure comprises an organic hole transport layer, an organic luminous layer, and an organic electron transport layer. A hole injecting electrode (anode) is placed on a glass substrate, on which the organic hole transport layer, organic luminous layer, organic electron transport layer and an electron injecting electrode (cathode) are sequentially layered one on top of another.

The two-layer structure includes structures known as an SH-A (Single Hetero-A) structure and an SH-B (Single Hetero-B) structure.

The SH-A structure excludes the organic electron transport layer, comprising the organic hole transport layer and organic luminous layer. The hole injecting electrode is placed on a glass substrate, on which the organic hole transport layer, organic luminous layer, and electron injecting electrode are sequentially layered one on top of another.

The SH-B structure excludes the organic hole transport layer, comprising the organic electron transport layer and organic luminous layer. The hole injecting electrode is placed on a glass substrate, on which the organic luminous layer, organic electron transport layer, and electron injecting electrode are sequentially layered one on top of another.

The hole injecting electrode is made of electrode materials having a large work function such as Au (gold) or ITO (In-Sn oxide); the work function of a metal means the energy supplied to free electrons to enable them to escape from the metal. Conversely the electron injecting electrode is made of electrode materials having a small work function, such as Mg (magnesium).

The organic hole transport layer is made of an organic material of p-type, while the organic electron transport layer is made of an organic material of n-type. The organic luminous layer is made of an organic material of n-type, p-type, and almost neutral in the SH-A structure, SH-B structure, and DH structure, respectively.

In any structure, the organic EL elements luminesce when the holes injected from the hole injecting electrode and the electrons injected from the electron injecting electrode recombine within the luminous layer at the boundary with the hole transport layer or electron transport layer.

Although the organic EL elements are advantageous over the non-organic EL elements, they face some problems to be solved. In particular, durability stands in the way of practical applications.

The luminosity of conventional organic EL elements degrades rapidly; a luminosity half-life is only tens hours when driven at a stable current. Causes of the degradation remain unrevealed; however, carriers accumulating at the boundary between the organic luminous layer and organic carrier transport layer are assumed to cause such degradation.

A report presented by Mori et al at "The 50th Applied Physics Lecture" at Nagoya University, Fall, 1989, 29p-ZP-7, reveals that the luminosity degradation of the organic EL elements subject to continuous luminescing can be recovered to some degree by applying a reverse bias voltage. This implies that the luminosity degradation is caused by the accumulated carriers at the boundary between the organic carrier transport layer and organic luminous layer.

Heat generated while the organic EL elements is driven is also assumed to cause the degradation. The heat causes molecules in each layer to crystalize, thus changing the structure between molecules.

SUMMARY OF THE INVENTION

Accordingly, base on the proposition that the carriers accumulated while the organic EL element is driven degrade the organic EL element, the present invention has an object to provide organic EL elements that maintain excellent luminous characteristics for a considerably long period (exhibit excellent durability) by reducing the amount of accumulated carriers or curbing degradation by heat.

The above object can be fulfilled by an organic EL element comprising a pair of a hole injecting electrode and an electron injecting electrode sandwiching an organic luminous layer and an organic carrier transport layer placed one on top of the other to have a boundary therebetween, characterized in that in at least one of the following: one of the organic luminous layer and the organic carrier transport layer, whichever placed closer to the hole injecting electrode, is doped with a first organic material, the first organic material being made of at least one substance, with a minimum level of a conducting band of the first organic material being lower than a minimum level of a conducting band of a material forming the layer to be doped with the first organic material; and the other layer which is placed closer to the electron injecting electrode is doped with a second organic material, the second organic material being made of at least one substance, with a maximum level of a valence band of the second organic material being higher than a maximum level of a valence band of the other layer to be doped with the second organic material.

A doped area of the organic carrier transport layer and a doped area of the organic luminous layer may have a contact to the boundary.

The minimum level of the conducting band of the first organic material may be equal to or lower than the minimum level of the conducting band of a material forming one of the organic luminous layer and the organic carrier transport layer, whichever has a lower minimum level for the conducting band.

The maximum level of the valence band of the second organic material may be equal to or higher than the maximum level of the valence band of a material forming one of the organic luminous layer and the organic carrier transport layer, whichever has a higher maximum level for the valence band.

The first organic material and the second organic material may be selected from a group consisting of rubrene, tris(8-hydroxyquinoline)aluminum, 4-(dicyanomethylene)-2-methyl-6-(4-dimethylaminostyryl)-4H-pyran, decacyclene, 1-ethyl-2-[(1-ethyl-2(1H)-quinolylidene)methyl]quinolinium iodide, naphthacene, 9,10-diphenylanthracene, which are expressed as Chemical Formulas 101, 102, 103, 104, 105, 106, and 107, respectively.

[Chemical Formula 101]

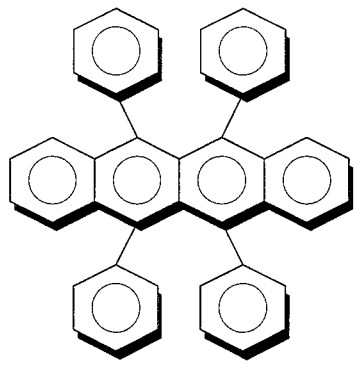

[Chemical Formula 102]

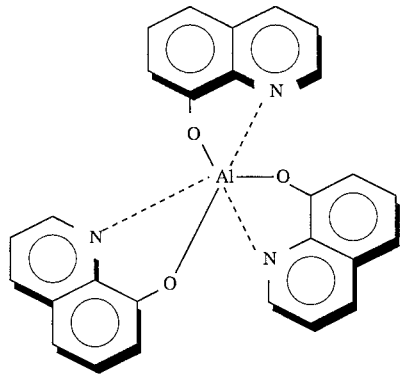

[Chemical Formula 103]

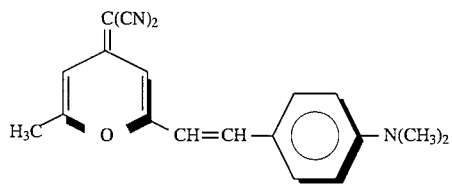

[Chemical Formula 104]

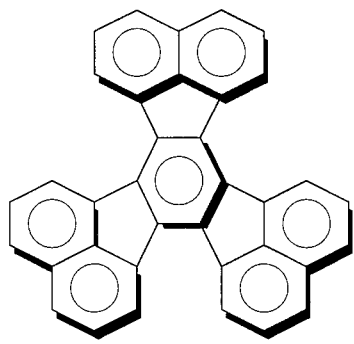

-continued

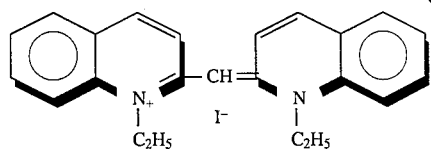

[Chemical Formula 105]

[Chemical Formula 106]

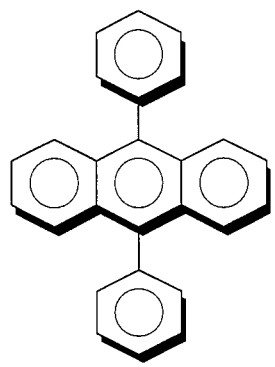

[Chemical Formula 107]

The organic carrier transport layer may be an organic hole transport layer, whereby the hole injecting electrode, organic hole transport layer, organic luminous layer, and electron injecting electrode are sequentially layered to form the organic EL element.

The minimum level of the conducting band of the first organic material may be equal to or lower than the minimum level of the conducting band of a material forming one of the organic luminous layer and the organic carrier transport layer, whichever has a lower minimum level for the conducting band.

The maximum level of the valence band of the second organic material may be equal to or higher than a maximum level of the valence band of a material forming one of the organic luminous layer and the organic carrier transport layer, whichever has a higher maximum level for the valence band.

The first organic material may include a fluorescent material, and a maximum level of a valence band of the fluorescent material is equal to or higher than a maximum level of the valence band of a material forming the organic hole transport layer.

The second material may include a fluorescent material, and a minimum level of a conducting band of the fluorescent material is equal to or lower than a minimum level of the conducting band of a material forming the organic luminous layer.

The first organic material and the second organic material may be selected from a group consisting of rubrene, tris(8-hydroxyquinoline)aluminum, 4-(dicyanomethylene)-2-methyl-6-(4-dimethylaminostyryl)-4H-pyran, decacyclene, 1-ethyl-2-[(1-ethyl-2(1H)-quinolylidene)methyl]quinolinium iodide, naphthacene, 9,10-diphenylanthracene, which are expressed as Chemical Formulas 108, 109, 110, 111, 112, 113, and 114, respectively.

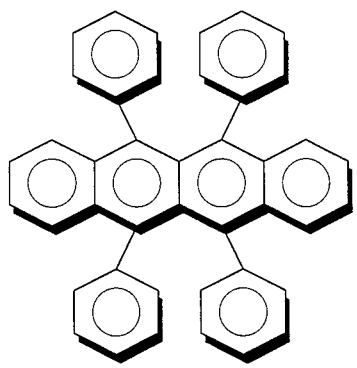

[Chemical Formula 108]

-continued

[Chemical Formula 109]

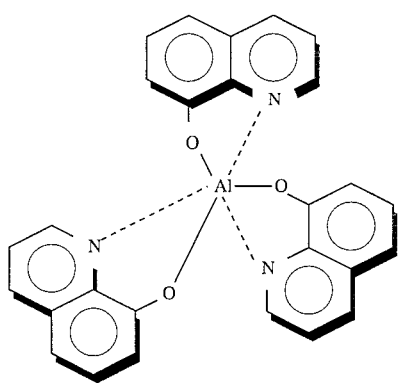

[Chemical Formula 110]

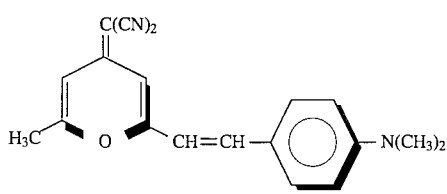

[Chemical Formula 111]

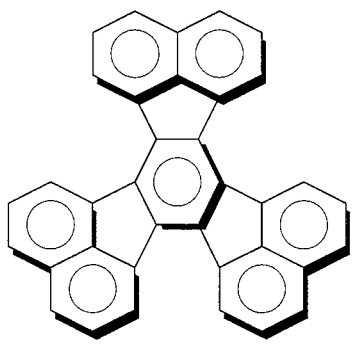

[Chemical Formula 112]

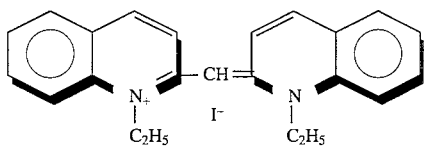

[Chemical Formula 113]

[Chemical Formula 114]

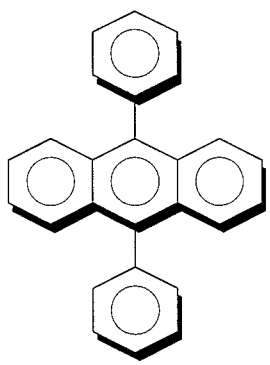

The organic carrier transport layer may be an organic electron transport layer, whereby the hole injecting electrode, organic luminous layer, organic electron transport layer, and electron injecting electrode are layered to form the organic EL element.

The minimum level of the conducting band of the first organic material may be equal to or lower than a minimum level of the conducting band of a material forming one of the organic luminous layer and the organic carrier transport layer, whichever has a lower minimum level for the conducting band.

The maximum level of the valence band of the second organic material may be equal to or higher than a maximum level of the valence band of a material forming one of the organic luminous layer and the organic carrier transport layer, whichever has a higher maximum level for the valence band.

The first organic material and the second organic material may be selected from a group consisting of rubrene, tris(8-hydroxyquinoline)aluminum, 4-(dicyanomethylene)-2-methyl-6-(4-dimethylaminostyryl)-4H-pyran, decacyclene, 1-ethyl-2-[(1-ethyl-2(1H)-quinolylidene)methyl]quinolinium iodide, naphthacene, 9,10-diphenylanthracene, which are expressed as Chemical Formulas 115, 116, 117, 118, 119, 120, and 121, respectively.

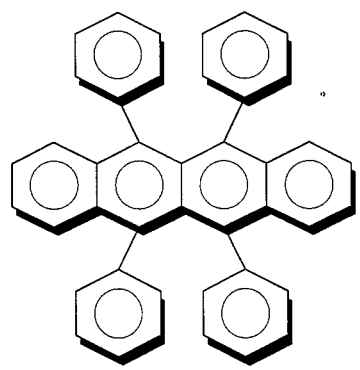

[Chemical Formula 115]

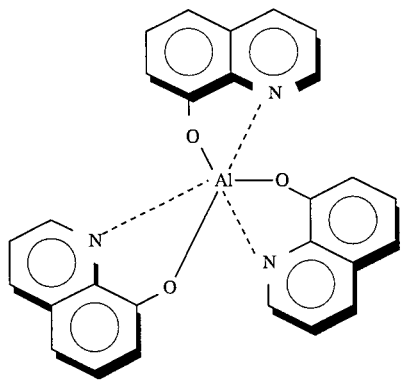

[Chemical Formula 116]

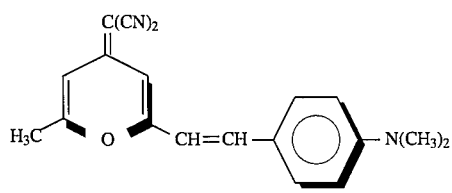

[Chemical Formula 117]

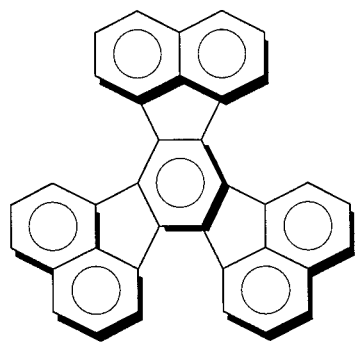

[Chemical Formula 118]

-continued

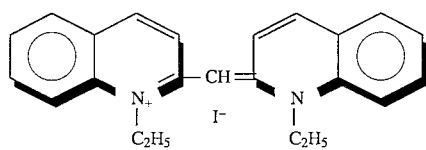

[Chemical Formula 119]

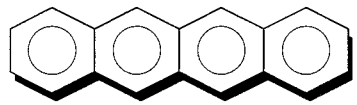

[Chemical Formula 120]

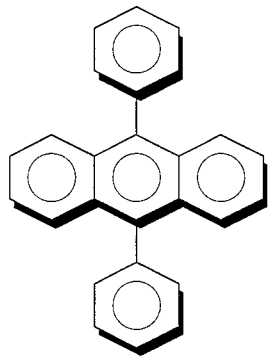

[Chemical Formula 121]

The above object can be also fulfilled by an organic EL element comprising a hole injecting electrode, an organic hole transport layer, an organic luminous layer, an organic electron transport layer, and an electron injecting electrode, the organic luminous layer having a contact with the organic hole transport layer to form a first boundary, the organic electron transport layer having contact with the organic luminous layer to form a second boundary, characterized by at least one of the following: an area where the organic hole transport layer has contact with the first boundary is doped with a first organic material, the first organic material being made of at least one substance, a minimum level of a conducting band of the first organic material being lower than a minimum level of a conducting band of a material forming the organic hole transport layer; and an area where the organic luminous layer has contact with the first boundary is doped with a second organic material, the second organic material being made of at least one substance, a maximum level of a valence band of the second organic material being higher than a maximum level of a valence band of a material forming the organic luminous layer.

The first organic material and the second organic material may be selected from a group consisting of rubrene, tris(8-hydroxyquinoline)aluminum, 4-(dicyanomethylene)-2-methyl-6-(4-dimethylaminostyryl)-4H-pyran, decacyclene, 1-ethyl-2-[(1-ethyl-2(1H)-quinolylidene)methyl]quinolinium iodide, naphthacene, 9,10-diphenylanthracene, which are expressed as Chemical Formulas 122, 123, 124, 125, 126, 127, and 128, respectively.

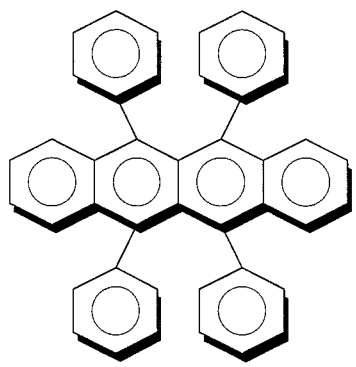

[Chemical Formula 122]

-continued

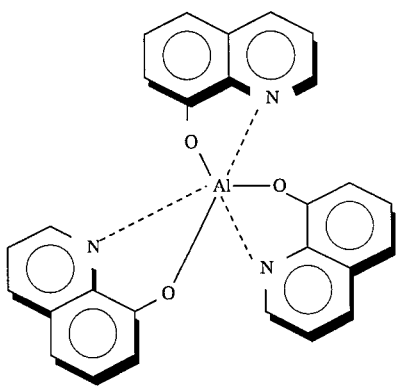

[Chemical Formula 123]

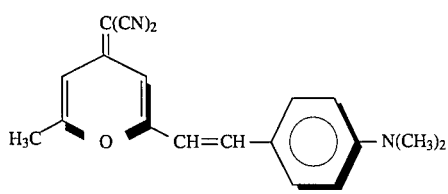

[Chemical Formula 124]

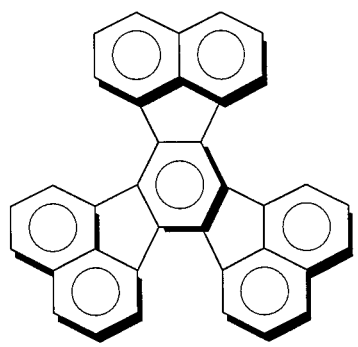

[Chemical Formula 125]

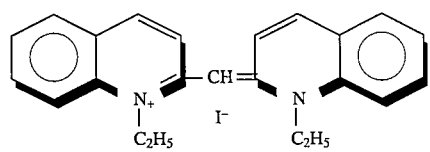

[Chemical Formula 126]

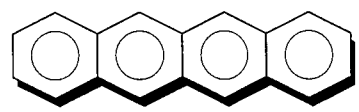

[Chemical Formula 127]

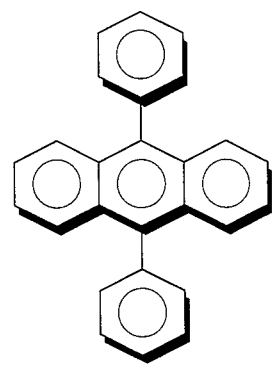

[Chemical Formula 128]

The above object can be also fulfilled by an organic EL element comprising a hole injecting electrode, an organic hole transport layer, an organic luminous layer, an organic electron transport layer, and an electron injecting electrode, the organic luminous layer having contact with the organic hole transport layer to form a first boundary, the organic electron transport layer having contact with the organic luminous layer to form a second boundary, characterized in that in at least one of the following: an area where the organic luminous layer has contact with the second boundary is doped with a first organic material, the first organic material being made of at least one substance, a minimum level of a conducting level of the first organic material being lower than a minimum level of a conducting band of a material forming the organic luminous layer; and an area where the organic electron transport layer has contact with the second boundary is doped with a second organic material, the second organic material being made of at least one substance, a maximum level of a valence band of the second organic material being higher than a maximum level of a valence band of a material forming the organic electron transport layer.

The first organic material and the second organic material may be selected from a group consisting of rubrene, tris(8-hydroxyquinoline)aluminum, 4-(dicyanomethylene)-2-methyl-6-(4-dimethylaminostyryl)-4H-pyran, decacyclene, 1-ethyl-2-[(1-ethyl-2(1H)-quinolylidene)methyl]quinolinium iodide, naphthacene, 9,10-diphenylanthracene, which are expressed as Chemical Formulas 129, 130, 131, 132, 133, 134, and 135, respectively.

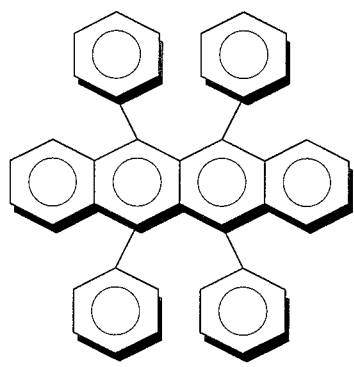

[Chemical Formula 129]

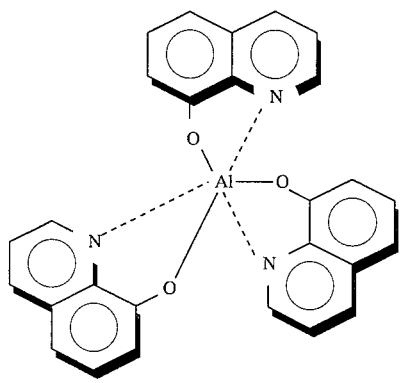

[Chemical Formula 130]

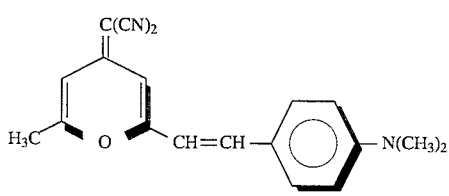

[Chemical Formula 131]

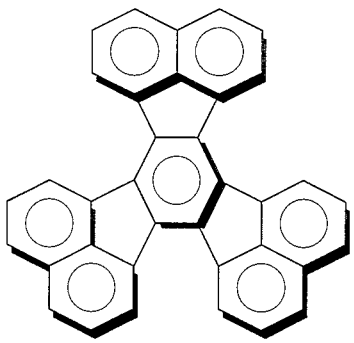

[Chemical Formula 132]

-continued

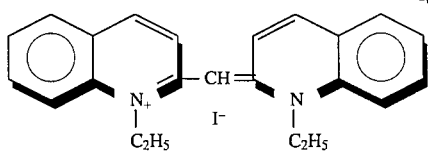

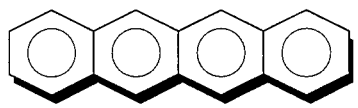

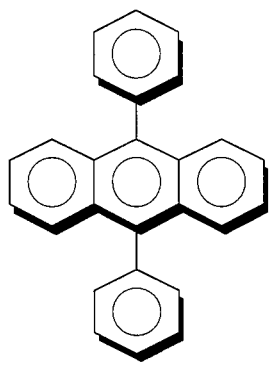

[Chemical Formula 133]

[Chemical Formula 134]

[Chemical Formula 135]

According to the above organic EL elements, the amount of the accumulated carriers can be reduced and the degradation by heat can be curbed, providing the organic EL elements with excellent durability. The improved organic EL elements can be applied to a broad range of applications such as flat-display units, LC (liquid crystal) back-lights, etc.

BRIEF DESCRIPTION OF THE DRAWINGS

These and other objects, advantages and features of the invention will become apparent from the following description thereof taken in conjunction with the accompanying drawings which illustrate a specific embodiment of the invention. In the drawings.

DESCRIPTION OF THE PREFERRED EMBODIMENT

The preferred embodiment of the present invention will be explained in the following.

A structure of an organic EL element of the present invention, which makes improvement in durability possible, will be explained with reference to the drawings.

Figure 1A:
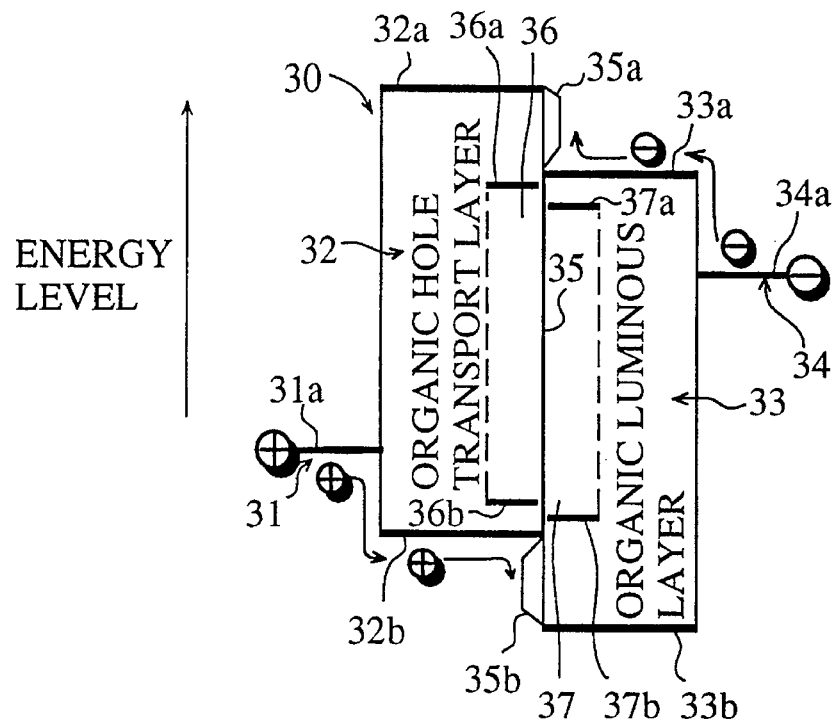
FIGS. 1A and 1B are schematic views showing structures of EL elements of the present invention.
Figure 1B:
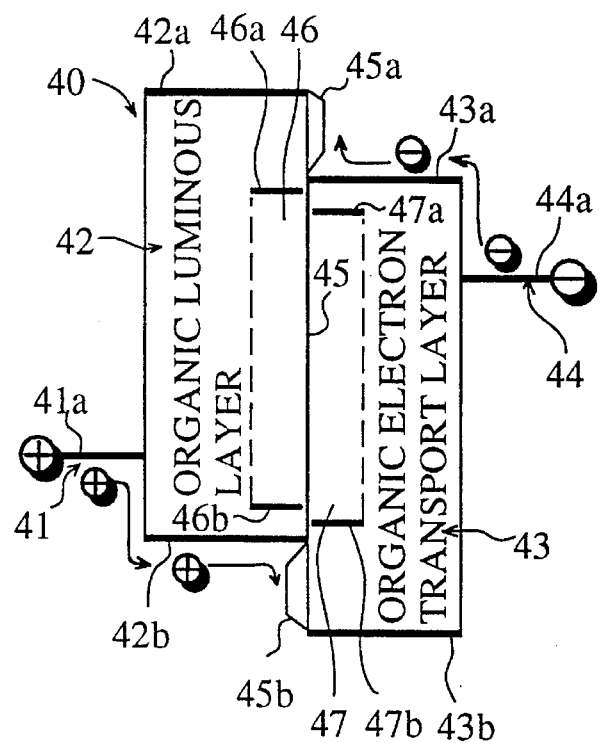

FIGS. 1A and 1B are the schematic views explaining the EL elements of the present invention. In the drawings, materials are layered in the horizontal direction, and energy levels of a conducting band and a valence band in each layer material are shown in the vertical direction.

FIG. 1A shows an SH-A organic EL element 30 comprising an organic hole transport layer 32 and an organic luminous layer 33, while FIG. 1B shows an SH-B organic EL element 40 comprising an organic luminous layer 42 and an organic electron transport layer 43.

In the first place, the mechanism of how the carriers accumulate in each organic EL element will be explained separately.

In case of the organic EL element 30, a hole injecting electrode 31, the organic hole transport layer 32, the organic luminous layer 33, and an electron injecting electrode 34 are layered from left to right, forming a boundary 35 between the organic hole transport layer 32 and organic luminous layer 33. Numeral 31a indicates the Fermi level of the hole injecting electrode 31. Numerals 32a and 32b indicate the minimum level of the conducting band and the maximum level of the valence band of the organic hole transport layer 32, respectively. Similarly, numerals 33a and 33b indicate the minimum level of the conducting band and the maximum level of the valence band of the organic luminous layer 33, respectively. Numeral 34a indicates the Fermi level of the electron injecting electrode 34.

The minimum level 32a of the conducting band of the organic hole transport layer 32 is higher than the minimum level 33a of the conducting band of the organic luminous layer 33. This energy level gap forms a barrier 35a at the boundary 35. Thus, the electrons, which are injected from the electron injecting electrode 34 and heading for the organic hole transport layer 32 (moving to the left) in the organic luminous layer 33, must go over the barrier 35a to go through the boundary 35 to enter the organic hole transport layer 32. This is assumed to cause the electrons to accumulate at the boundary 35 in the organic luminous layer 33.

Also, the maximum level 33b of the valence band of the organic luminous layer 33 is lower than the maximum level 32b of the valence band of the organic hole transport layer 32. This energy gap forms a barrier 35b at the boundary 35. Thus, the holes, which are injected from the hole injecting electrode 31 and heading for the organic luminous layer 33 (moving to the right) in the organic hole transport layer 32, must go over the barrier 35b to go through the boundary 35 to enter the organic luminous layer 33. This is assumed to cause the holes to accumulate at the boundary 35 in the organic hole transport layer 32.

However, note that the amount of the accumulated holes is relatively small, because the organic EL element 30 is structured in such a way that the organic luminous layer 33 luminesces efficiently. In other words, the holes go over the barrier 35b more easily than do the electrons over the barrier 35a, so that most of the electrons and holes re-combine within the organic luminous layer 33.

In case of the organic EL element 40, a hole injecting electrode 41, the organic luminous layer 42, the organic electron transport layer 43, and an electron injecting electrode 44 are layered from left to right, forming a boundary 45 between the organic luminous layer 42 and organic electron transport layer 43. Numeral 41a indicates the Fermi level of the hole injecting electrode 41. Numerals 42a and 42b indicate the minimum level of the conducting band and the maximum level of the valence band of the organic luminous layer 42, respectively. Similarly, numerals 43a and 43b indicate the minimum level of the conducting band and the maximum level of the valence band of the organic electron transport layer 43, respectively. Also, numeral 44a indicates the Fermi level of the electron injecting electrode 44.

The maximum level 43b of the valence band in the organic electron transport layer 43 is lower than the maximum level 42b of the valence band of the organic luminous layer 42. This energy level gap forms a barrier 45b at the boundary 45. Thus, the holes, which are injected from the hole injecting electrode 41 and heading for the organic electron transport layer 43 (moving to the right) in the organic luminous layer 42, must go over the barrier 45b to go through the boundary 45 to enter the organic electron transport layer 43. This is assumed to cause the holes to accumulate at the boundary 45 in the organic luminous layer 42.

Also, the minimum level 42a of the conducting band of the organic luminous layer 42 is higher than the minimum level 43a of the conducting band of the organic electron transport layer 43. This energy level gap forms a barrier 45a at the boundary 45. Thus, the electrons, which are injected from the electron injecting electrode 44 and heading for the organic luminous layer 42 (moving to the left) in the organic electron transport layer 43, must go over the barrier 45a to go through the boundary 45 to enter the organic luminous layer 42. This is assumed to cause the electrons to accumulate at the boundary 45 in the organic electron transport layer 43.

However, note that the amount of the accumulated electrons is relatively small because the organic EL element 40 is structured in such a way that the organic luminous layer 42 luminesces efficiently: the electrons go over the barrier 45a more easily than do the holes over the barrier 45b, so that most of the electrons and holes re-combine within the organic luminous layer 42.

As has been explained, both in the organic EL elements 30 and 40, the carriers accumulate at the boundaries, in particular, at the side of the organic luminous layer, and such accumulation is assumed to cause the degradation.

To minimize such accumulation, a dopant is used in the present invention, and the mechanism of how the dopant reduces the accumulation will be explained.

In the organic EL element 30, when the organic hole transport layer 32 is doped with a dopant 36, which has the minimum level 36a of the conducting band lower than the minimum level 32a of the conducting band of the organic hole transport layer 32, the electrons accumulated in the organic luminous layer 33 are trapped by the dopant 36 over the barrier 35a through the boundary 35. That is to say, the barrier 35a, which the electrons must go over to go through the boundary 35, is partially broken down by the dopant 36. In addition, when the minimum level 36a of the conducting band of the dopant 36 is equal to or lower than the minimum level 33a of the conducting band of the luminous layer 33, the electrons accumulated in the organic luminous layer 33 are trapped more effectively.

As well, when the luminous layer 33 is doped with a dopant 37, which has the maximum level 37b of the valence band higher than the maximum level 33b of the valence band of the luminous layer 33, the accumulated holes in the organic hole transport layer 32 are trapped by the dopant 37 over the barrier 35b through the boundary 35. That is to say, the barrier 35b, which the holes must go over to go through the boundary 35, is partially broken down by the dopant 37. In addition, when the maximum level 37b of the valence band of the dopant 37 is equal to or higher than the maximum level 32b of the valence band of the organic hole transport layer 32, the holes accumulated in the organic hole transport layer 32 are trapped more effectively.

In this way, the dopants 36 and 37 are assumed to decrease the amount of the accumulated carriers at the boundary 35 in the organic EL element 30.

Similarly in the organic EL element 40, when the organic luminous layer 42 is doped with a dopant 46, which has the minimum level of the conducting band 46a lower than the minimum level 42a of the conducting band of the organic luminous layer 42, the electrons are trapped by the dopant 46 over the barrier 45a through the boundary 45. That is to say, the barrier 45a at the boundary 45 is partially broken down by the dopant 46. In addition, when the minimum level 46a of the conducting band of the dopant 46 is equal to or lower than the minimum level 43a of the conducting band of the organic electron transport layer 43, the electrons are trapped more effectively.

When the organic electron transport layer 43 is doped with a dopant 47, which has the maximum level 47b of the valence band higher than the maximum level 43b of the valence band of the organic electron transport layer 43, the holes are trapped by the dopant 47 over the barrier 45b through the boundary 45. That is to say, the barrier 45b on the boundary 45 is partially broken down by the dopant 47. In addition, when the maximum level 47b of the valence band of the dopant 47 is equal to or higher than the maximum level 42b of the valence band of the organic luminous layer 42, the holes are trapped more effectively.

In this way, the dopants 46 and 47 are assumed to reduce the amount of the accumulated carriers around the boundary 45 in the organic EL element 40.

When the dopants are fluorescent materials, the dopants may luminesce when trapping the electrons and holes. However, this happens only when the dopant to the organic hole transport layer has the maximum level of the valence band higher than that of the material forming the organic hole transport layer. More precisely, in the organic EL element 30, the dopant 36 will not luminesce unless the maximum level 36b of the valence band is equal to or higher than the maximum level 32b of the valence band of the organic hole transport layer 32, and the dopant 37 will not luminesce unless the minimum level 37a of the conducting band is equal to or lower than the minimum level 33a of the organic luminous layer 33. Also, the dopant to the organic luminous layer must have the minimum level of the conducting band equal to or lower than that of the materials forming the organic luminous layer to luminesce.

Note that the aforementioned are not the sufficient conditions but only the necessary conditions for the dopant to luminesce. Thus, only satisfying the aforementioned does not necessarily ensure the dopant's luminescing.

Also, note that the carriers' energy is released as a thermal energy when the dopant luminesces, and the thermal energy is partially converted into a photo-energy while the organic EL element is driven. This means that dopant's luminescing reduces the amount of the thermal energy that may cause layer's crystallization while improving luminescing efficiency.

In view of the foregoing, several examples and a comparative example were conducted to evaluate the improvement realized by the present invention, which will be described hereunder.

EXAMPLE 1

Figure 2:
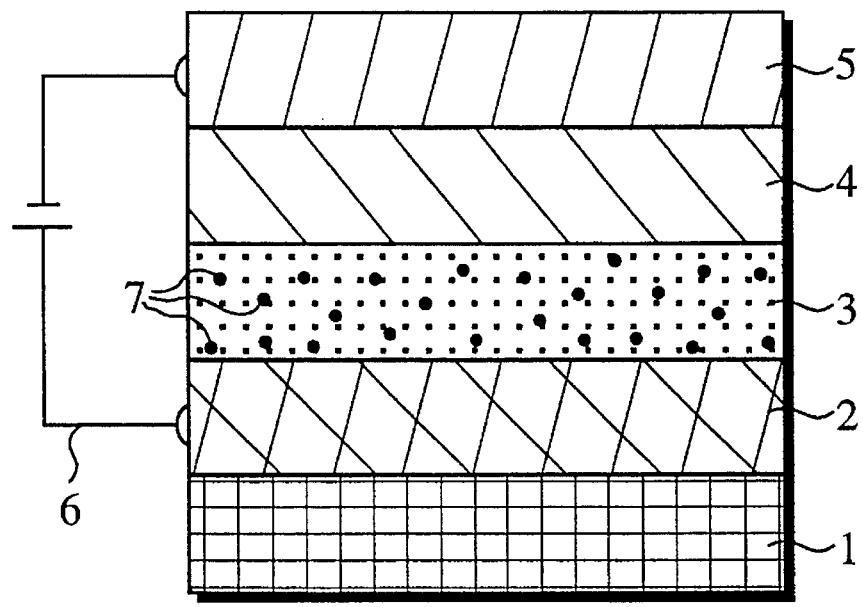
FIG. 2 is a schematic view showing a cross sectional view of organic EL elements A1 through A7 of the present invention.

The explanation of organic EL elements A1 through A7 of SH-A structure in accordance with Example 1 will be given. In this example, the organic hole transports layer of each organic EL element is doped. FIG. 2 shows the cross sectional view of the organic EL elements A1 through A7.

The organic EL element A1 Comprises a glass substrate 1, an anode 2, an organic hole transport layer 3, an organic luminous layer 4, and a cathode 5, which are sequentially layered one on top of another. Leads 6 are connected to the anode 2 and cathode 5 respectively to apply a voltage when the organic EL elements A1 is driven.

More precisely, the anode 2, which is in effect an ITO film, is adhered to the substrate 1.

The organic hole transport layer 3 is 500 Å thick, and made of N,N'-diphenyl-N,N'-bis(3-methylphenyl)-1,1'-biphenyl-4,4'-diamine (hereinafter referred to as MTPD), which is expressed as Chemical Formula 1.

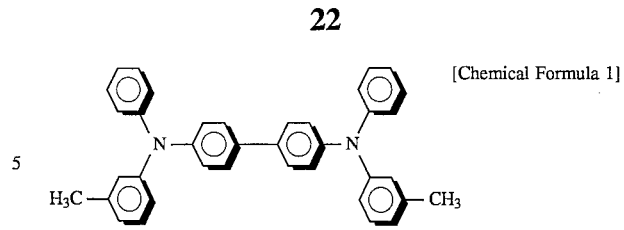

[Chemical Formula 1]

The organic hole transport layer 3 is doped with a dopant 7, or 2 wt % rubrene. Rubrene, expressed as Chemical Formula 2 below, exhibits a luminescent peak wave length of 570 nm when vapor deposited to be a single layer.

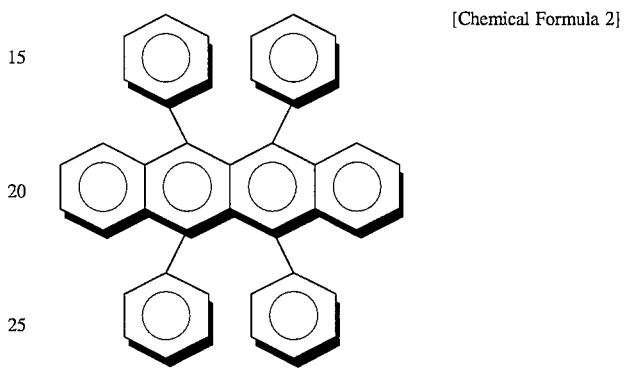

[Chemical Formula 2]

Thus, the organic hole transport layer 3 is in effect composed of MTPD and rubrene, which were vapor deposited on the anode 2 to form a 500 Å thick single layer.

The organic luminous layer 4 is 500 Å thick, and made of tris(8-hydroxyquinoline)aluminum (hereinafter referred to as Alq3). Alq3, expressed as Chemical Formula 3 below, exhibits a luminescent peak wave length of 530 nm when vapor deposited to be a single layer. The organic luminous layer 4 was vacuum vapor deposited on the organic hole transport layer 3.

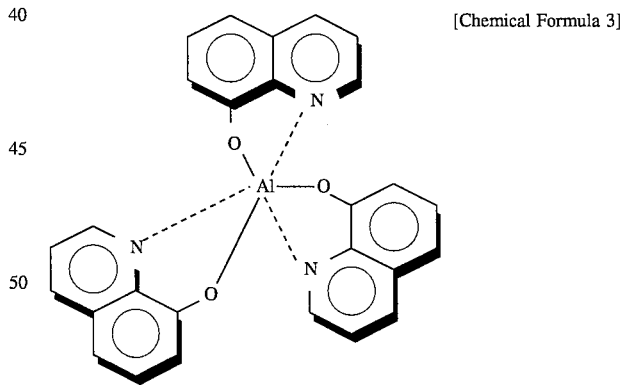

[Chemical Formula 3]

The cathode 5 is a 2000Å thick layer made of Mg-In alloy, and was vacuum vapor deposited on the organic luminous layer 4. Note that the degree of vacuum at each vapor deposition was $10^{-5}$ Torr.

The organic EL elements A2 through A7 were made in the same manner as the organic EL element A1 to have the same structure except for the dopant 7: 4-(dicyanomethylene)-2-methyl-6-(4-dimethylaminostyryl)-4H-pyran (hereinafter referred to as DCM) was used for A2, decacyclene for A3, 1-ethyl-2-[(1-ethyl-2(1H)-quinolylidene)methyl]quinolinium iodide (hereinafter referred to as NK-757) for A4, naphthacene for A5, Alq3 for A6, and 9,10-diphenylanthracene (hereinafter referred to as DPA) for A7. They are respectively expressed as Chemical Formulas 4, 5, 6, 7, 3, 8, which are shown below except for Chemical Formula 3.

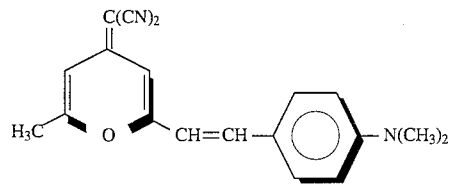
[Chemical Formula 4]

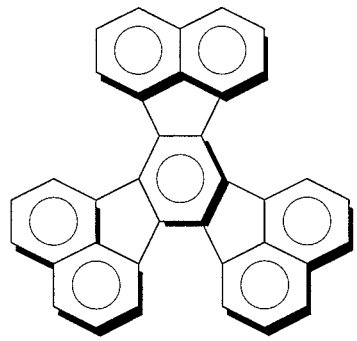
[Chemical Formula 5]

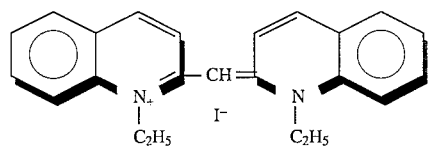
[Chemical Formula 6]

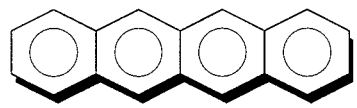
[Chemical Formula 7]

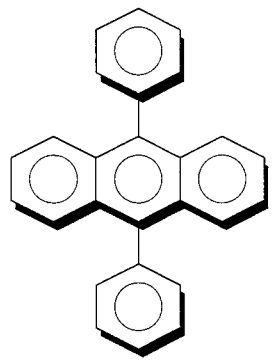
[Chemical Formula 8]

Note that all the above dopants are fluorescent materials.

The maximum level of the valence band and minimum level of the conducting level of the organic hole transport layer 3, luminous layer 4, and each dopant for the organic EL elements A1 through A7 were evaluated and the result is set forth in TABLE 1.

TABLE 1

| MAIN MATERIAL | ORGANIC EL ELEMENT COMMON | ORGANIC HOLE TRANSPORT LAYER | | | ORGANIC LUMINOUS LAYER | | |
|---|---|---|---|---|---|---|---|
| | | MATERIAL MTPD | VALENCE BAND MAX. LEVEL (eV) −5.4 | CONDUCTING BAND MIN. LEVEL (eV) −2.3 | MAT- ELIAL Alq3 | VALENCE BAND MAX. LEVEL (eV) −5.6 | CONDUCTING BAND MIN. LEVEL (eV) −2.8 |
| DOPANT | A1 | RUBRENE | −5.4 | −3.2 | — | — | — |
| | A2 | DCM | −5.4 | −3.2 | — | — | — |
| | A3 | DECACYCLENE | −5.3 | −2.8 | — | — | — |
| | A4 | NK-757 | −5.1 | −2.9 | — | — | — |
| | A5 | NAPHTHACENE | −5.3 | −3.0 | — | — | — |
| | A6 | $Alq^3$ | −5.6 | −2.8 | — | — | — |
| | A7 | DPA | −5.7 | −2.8 | — | — | — |
| | A8 | — | — | — | DECACYCLENE | −5.3 | −2.8 |
| | X1 | — | — | — | — | — | — |

| MAIN MATERIAL | ORGANIC EL ELEMENT COMMON | LUMINOSITY HALF-LIFE ON CONTINUOUS OPERATION (hours) | LUMINESCENT PEAK WAVE LENGTH (mm) | DOPANT'S LUMINESCING |
|---|---|---|---|---|
| DOPANT | A1 | 170 | 550 | ○ |
| | A2 | 104 | 550 | ○ |
| | A3 | 110 | 540 | ○ |
| | A4 | 43 | 540 | ○ |
| | A5 | 68 | 530 | X |
| | A6 | 181 | 530 | X |
| | A7 | 74 | 530 | X |
| | A8 | 48 | 520 | X |
| | X1 | 21 | 530 | — |

Both the maximum level of the valence band and minimum level of the conducting level were found as follows with a reference to the vacuum level zero.

The maximum level of the valence band was found by attaching a negative sign to an ionization potential of each layer (in effect, a single film made by vapor deposition) found by photo-electron spectrometry. The minimum level of the conducting band was found by adding a band gap to the maximum level of the valence band. The band gap was found by photo-absorption with each layer using Ono's method (J. Phys. Soc. Jpn. 58(1989)1895).

TABLE 1 reveals that the minimum levels of the conducting bands of the dopants 7 used for the organic EL elements A1 through A7 are in the range of from −2.8 eV to −3.2 eV, which is lower than −2.3 eV, the minimum level of the conducting band of MTPD forming the organic hole transport layer 3. TABLE 1 also reveals that the minimum levels of the conducting bands of the dopants 7 used for the organic EL elements A1 through A7 are equal to or lower than −2.8 eV, the minimum level of the conducting band of Alq3 forming the organic luminous layer 4. This means the dopants 7 used for the organic EL elements A1 through A7 satisfy the aforementioned conditions of a suitable dopant.

EXAMPLE 2

Figure 3:
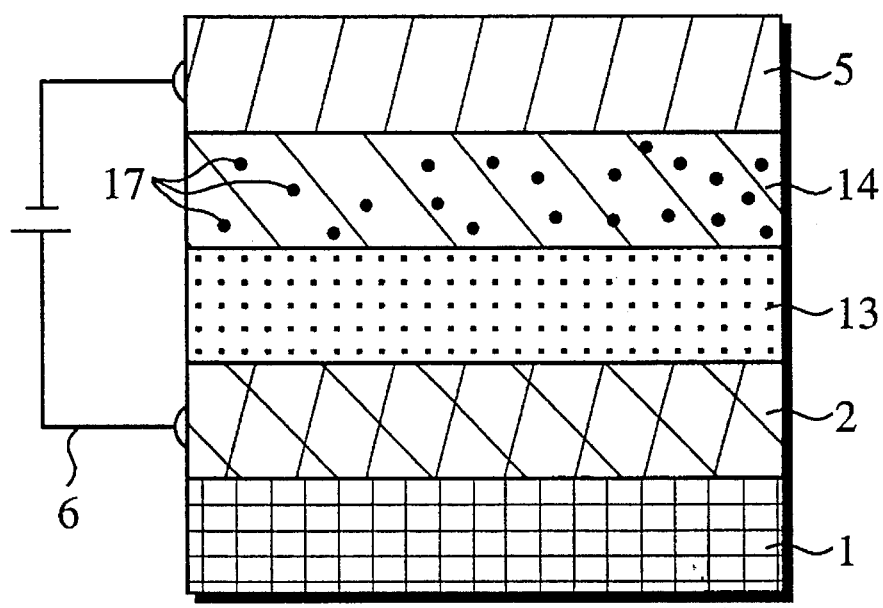
FIG. 3 is a schematic view showing a cross sectional view of an organic EL element A8 of the present invention.

The explanation of an organic EL element A8 of Example 2 will be given. In this example, the organic luminous layer of the organic EL element A8 is doped. FIG. 3 shows the cross sectional view of the organic EL element A8. Like components are labeled with like reference numerals with respect to Example 1, and the description of these components is not repeated.

An organic hole transport layer 13 was formed in the same manner as the organic hole transport layer 3 in FIG. 2 to have the same structure except that it is not doped with the dopant 7 to comprise only MTPD.

An organic luminous layer 14 is 500 Å thick and made of an Alq3 doped with a dopant 17, or a 1 wt % decacyclene. Alq3 and decacyclene were vapor deposited on the organic hole transport layer 13 to form a 500 Å thick single layer at the degree of vacuum of about $10^{-5}$ Torr.

The maximum level of the valence band and the minimum level of the conducting band as well as the luminosity half-life of the dopant 17 were also evaluated and the result is set forth in TABLE 1.

TABLE 1 reveals that the dopant 17 used for the organic EL element A8 has −5.3 eV as the maximum level of the valence band, which is higher than −5.6 eV, the maximum level of the valence band of Alq3 forming the organic luminous layer 14, and −5.4 eV, the maximum level of the valence band of MTPD forming the organic hole transport layer 13. This means that the dopant 17 also satisfies the aforementioned conditions for a suitable dopant.

Comparative Example

Figure 4:
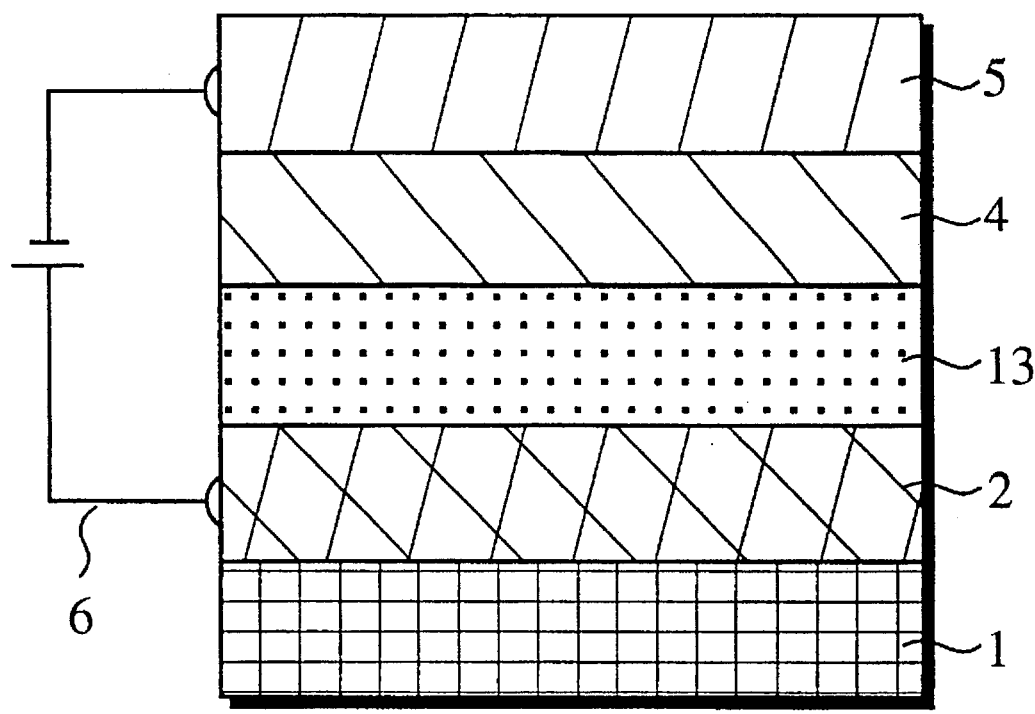
FIG. 4 is a schematic view showing a cross sectional view of an organic EL element X1 as a comparative example to the present invention.

An organic EL element X1 was formed as a comparative example, and neither the organic transport layer nor organic luminous layer is doped in this example. FIG. 4 shows the cross sectional view of the organic EL element X1.

The organic EL element X1 is of the same structure as the organic EL element A1 except that the organic hole transport layer 3 is replaced with the organic hole transport layer 13 of Example 2: the organic hole transport layer 13 is made of only MTPD and the organic luminous layer 4 is made of only Alq3, neither of them being doped. Like components are labeled with like reference numerals with respect to Example 1, and the description of these components is not repeated.

Experiment

With the above constructed organic EL elements A1 through A8 and the comparative example of the organic EL element X1, a luminosity half-life (change in luminosity in time series), and a luminescence peak wave length were evaluated. The experiment was performed by driving each organic EL element at a stable current of 10 mA/cm$^2$.

The result of the experiment is set forth in TABLE 1 on the right, which reveals that the organic EL elements A1 through A8 show longer luminosity half-lives compared with the organic EL element X1, indicating the improvement in durability. The improvement is assumed to be made possible by the dopants 7 and 17 doping the organic hole transport layer 3 and the organic luminous layer 14, respectively.

In particular, the organic EL elements A1 through A3 and A5 through A7 show considerably long luminosity half-lives. This suggests that doping the organic hole transport layer 3 is more effective than doping the organic luminous layer 14.

With the organic EL elements A1 through A5, the maximum levels of the valence bands of the dopants 7 doping the organic hole transport layers 3 is in the range of from −5.1 eV to −5.4 eV, which is equal to or higher than −5.4 eV, the maximum level of the valence band of MTPD forming the organic hole transport layer 3. Particularly, note that the dopants 7 used in the organic EL elements A1 through A4 luminesce while the dopant 7 used in the organic E1 element A5 does not. Whereas with the organic EL elements A6 and A7, the maximum levels of the valence bands of the dopants 7 doping the organic hole transport layers 3 are −5.6 eV and −5.7 eV respectively, which are lower than −5.4 eV, the maximum level of the valence band of MTPD forming the organic hole transport layer 3, resulting in the dopants 7's non-luminescing.

The experiment result suggests that the dopant 7 must have the maximum level of the valence band higher than that of the material forming the organic hole transport layer 3 to luminesce.

The dopant 7 and dopant 17 are the fluorescent materials in the organic EL elements A1 through A8; however, the dopants 7 and 17 are not limited to the fluorescent materials. Any organic substance can serve as the dopant 7 as long as it has the minimum level of the conducting band lower than that of the material forming the organic hole transport layer 3. Likewise, any organic substance can serve as the dopant 17 as long as it has the maximum level of the valence band higher than that of the material forming the organic luminous layer 14.

EXAMPLE 3

In this example, the density of the dopant to the organic hole transport layer varies.

In the organic EL element A1, the density of the dopant 7 (rubrene) doping the organic hole transport layer 3 was changed to 0 wt %, 1 wt %, 2 wt %, 5 wt %, and 10 wt % to evaluate the luminosity half-lives in the same manner as the above experiment. The result of the experiment is set forth in TABLE 2.

TABLE 2

| DOPANT'S DENSITY (WT %) | LUMINOSITY HALF-LIFE ON CONTINUOUS OPERATION (HOURS) |
|---|---|
| 0 | 21 |
| 1 | 55 |
| 2 | 170 |
| 5 | 189 |
| 10 | 26 |

TABLE 2 reveals that the luminosity half-life is proportional to the dopant density up to 5 wt % but is shortened at 10 wt %. This means the durability is improved at a certain range of dopant density: less than 10 wt % and most preferably about 5 wt %.

FOURTH EXAMPLE

In this example, the organic hole transport layer is doped at various areas.

Organic EL elements A6(a) and A6(b) are of the same structure as the organic EL element A6 except that half of the organic hole transport layer 3 (MTPD) at the anode side and at the cathode side (at the organic luminous layer side) is doped by the dopant 7 (Alq3), respectively.

More precisely, the 500 Å thick organic hole transport layer 3 is entirely doped with 2 wt % Alq3 by vapor deposition in the organic EL element A6, while in the organic EL element A6(a), half of the organic hole transport layer (up to a thickness of 250 Å) is doped with 2 wt % Alq3 at the anode side by vapor deposition. Similarly, in the organic EL element A6(b), half of the organic hole transport layer (up to a thickness of 250 Å) is doped with 2 wt % Alq3 at the organic luminous layer side by vapor deposition.

Organic EL elements A1(a) and A1(b) are of the same structure as the organic EL element A1 except that the hole transport layer 3 (MTPD) is doped with the 10 wt % dopant (rubrene) entirely and in half of the organic luminous layer, respectively.

More precisely, in the organic EL element A1, the 500 Å thick organic hole transport layer 3 is doped with 2 wt % rubrene entirely by vapor deposition, while in the organic EL element A1(a), the entire organic hole transport layer 3 (500 Å thick) is doped with 10 wt % rubrene by vapor deposition. Similarly, in the organic EL element A1(b), half of the hole transport layer 3 (up to 250 Å thick) is doped with 10 wt % rubrene at the half side of the organic luminous layer by vapor deposition. The luminosity half-lives of the organic EL elements A6(a), A6(b), A1(a), and A1(b) were evaluated in the same manner as the above experiment, and the result of the experiment is set forth in TABLE 3 with the organic EL element A6 and the comparative example of the organic EL element X1.

TABLE 3

| ORGANIC EL ELEMENT | DOPANT | DOPED AREA ON ORGANIC HOLE TRANSPORT LAYER (THICKNESS) | LUMINOSITY HALF-LIFE ON CONTINUOUS OPERATION (HOURS) |
|---|---|---|---|
| X1 | | NONE | 21 |
| A6 | Alq3 (2%) | ENTIRELY (500Å) | 181 |
| A6(a) | Alq3 (2%) | HALF SIDE AT ANODE (250Å) | 6 |
| A6(b) | Alq3 (2%) | HALF SIDE AT ORGANIC LUMINOUS LAYER (250Å) | 46 |
| A1(a) | RUBRENE (10%) | ENTIRELY (500Å) | 26 |
| A1(b) | RUBRENE (10%) | HALF SIDE AT ORGANIC LUMINOUS LAYER (250Å) | 195 |

TABLE 3 reveals that the organic EL elements A6 and A1(a) whose organic hole transport layers are entirely doped, and the organic EL elements A6(b) and A1(b) whose organic hole transport layers 3 are doped at the half side of the organic luminous layers 4 show longer luminosity half-lives compared with the organic EL element X1. Whereas the organic EL element A6(a), whose organic hole transport layer 3 is doped at the half side of the anode shows a shorter luminosity half-life compared with the non-doped organic EL element X1.

This means that the area being doped on the organic carrier transport layer must have a contact to the boundary with the organic luminous layer to improve the durability.

Although the detailed explanation is omitted, the same can be said in case of doping the organic luminous layer: a doped area of the organic luminous layer must have a contact to the boundary with the organic carrier transport layer.

FIFTH EXAMPLE

In this example, both the organic hole transport layer and organic luminous layers are doped.

Organic EL elements A9 through A11 are of the same structure as the organic EL element A1, except that the organic hole transport layer 3 is doped with rubrene at various density and the organic luminous layer 4 is doped with 1 wt % rubrene.

More precisely, the organic hole transport layers 3 in the organic EL elements A9, A10, and A11 are MTPD doped with 2 wt %, 5 wt %, and 10 wt % rubrene respectively.

The organic luminous layers 4 of the organic EL elements A9, A10, and A11 are all made of Alq3 and doped with 1 wt % rubrene.

The luminosity half-lives of the organic EL elements A1, A9, A10, and A11 were evaluated in the same manner as above and the result is set forth in TABLE 4 with the comparative example of the organic EL element X1.

TABLE 4

| ORGANIC EL ELEMENT | DOPANT'S DENSITY ON ORGANIC HOLE TRANSPORT LAYER (wt %) | DOPANT'S DENSITY ON ORGANIC LUMINOUS LAYER (wt %) | LUMINOSITY HALF-LIFE ON CONTINUOUS OPERATION (HOURS) |
|---|---|---|---|
| X1 | 0 | 0 | 21 |
| A1 | 2 | 0 | 170 |
| A9 | 2 | 1 | 399 |
| A10 | 5 | 1 | 175 |
| A11 | 10 | 1 | 82 |

TABLE 4 reveals that the organic EL element A1 retains the luminosity half-life of 170 hours while the organic EL element A9 retains a more excellent luminosity half-life of 399 hours. As has been stated, the organic transport layers 3 in both the elements are doped with 2 wt % rubrene, and the organic luminous layer 4 in the organic EL element A9 is doped with 1 wt % rubrene.

This means the doping the organic luminous layer 4 in addition to the organic hole transport layer 3 further prolongs the luminosity half-life, or improves durability.

Also, TABLE 4 reveals that the luminosity half-life of the organic EL element A9 is longer than that of the organic EL element A10, and the luminosity half-life of the organic EL element A10 is longer than that of the organic EL element A11, when 2 wt %, 5 wt %, and 10 wt % rubrene are respectively used in the organic EL elements A9, A10, and A11. This means the durability is improved most effectively at a certain dopant density in case of doping both the organic hole transport layer 3 and organic luminous layer 4: 2 wt % in this example.

The above organic EL elements are all SH-A structure comprising the organic hole transport layer and organic luminous layer. However, the same effect can be obtained with the organic EL elements of SH-B structure comprising the organic luminous layer and organic electron transport layer, or the organic EL elements of DH structure.

In case of the SH-B structure, the organic luminous layer may be made of NSD expressed as Chemical Formula 9 below or hole transporting materials such as PYR-1 through PYR-14 expressed as Chemical Formulas 10 through 23 below, respectively. The organic electron transport layer may be made of OXD-1 expressed as Chemical Formula 24, OXD-7 expressed as Chemical Formula 25, and PBD expressed as Chemical Formula 26.

[Chemical Formula 9]

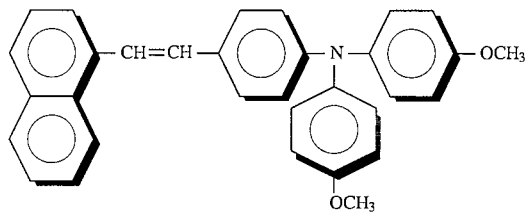

[Chemical Formula 10]

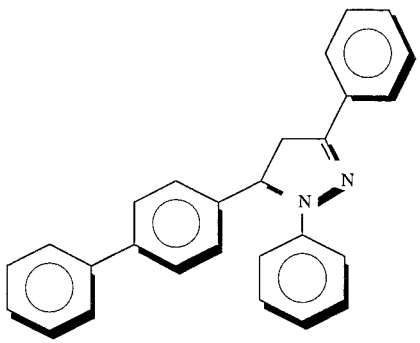

[Chemical Formula 11]

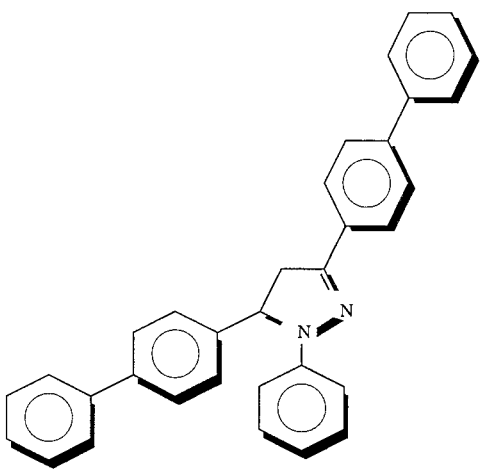

[Chemical Formula 12]

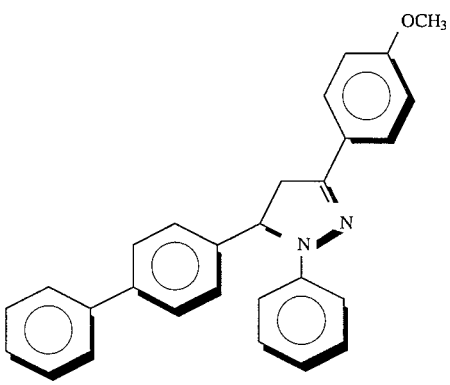

-continued
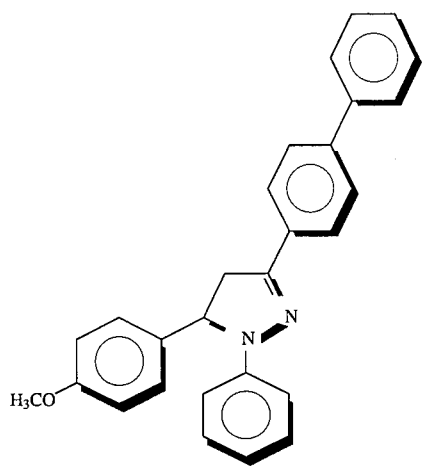
[Chemical Formula 13]
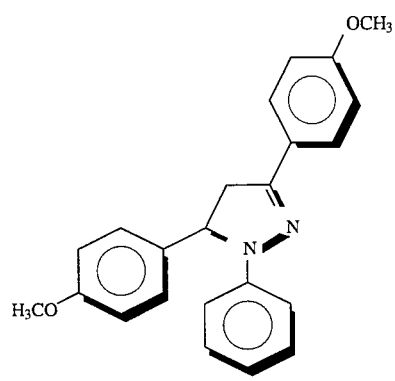
[Chemical Formula 14]
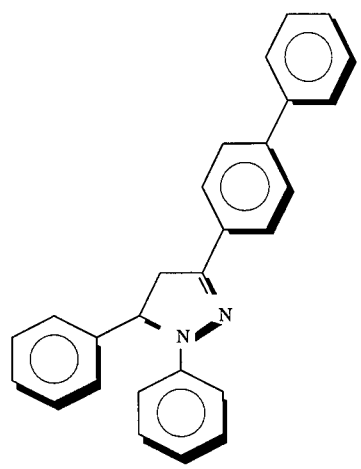
[Chemical Formula 15]
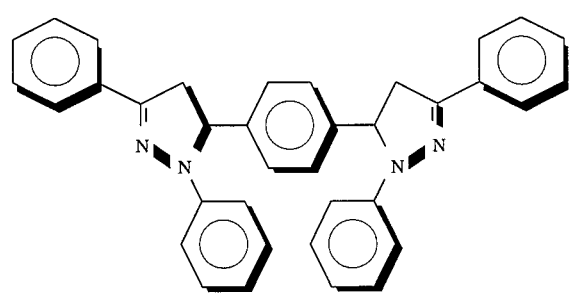
[Chemical Formula 16]

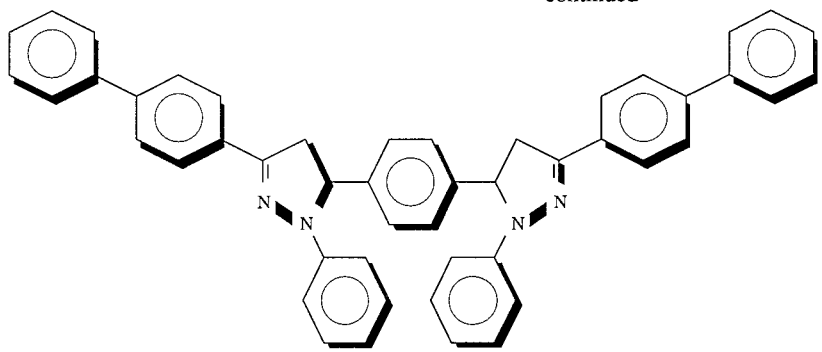
[Chemical Formula 17]
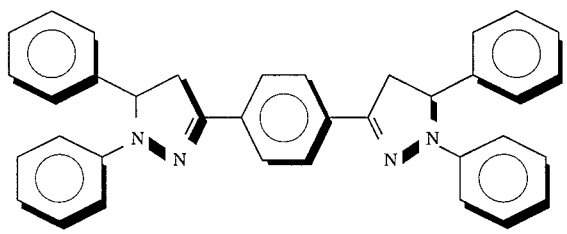
[Chemical Formula 18]
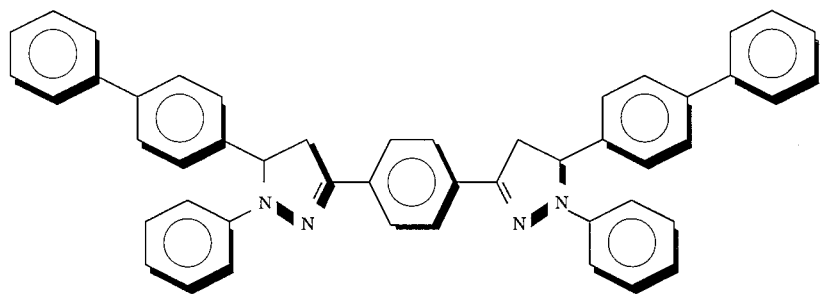
[Chemical Formula 19]
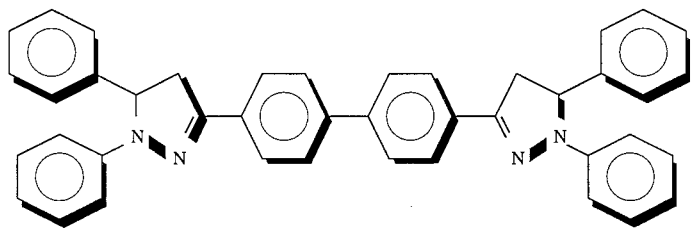
[Chemical Formula 20]
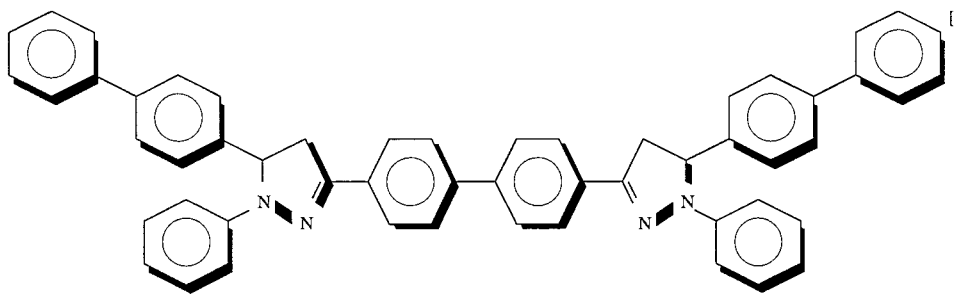
[Chemical Formula 21]

[Chemical Formula 22]
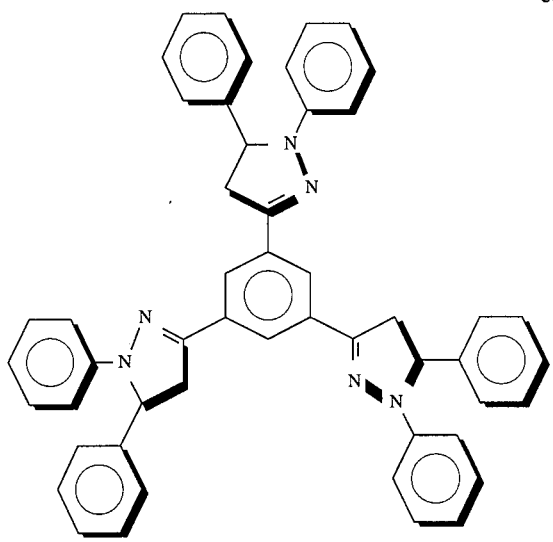
[Chemical Formula 23]
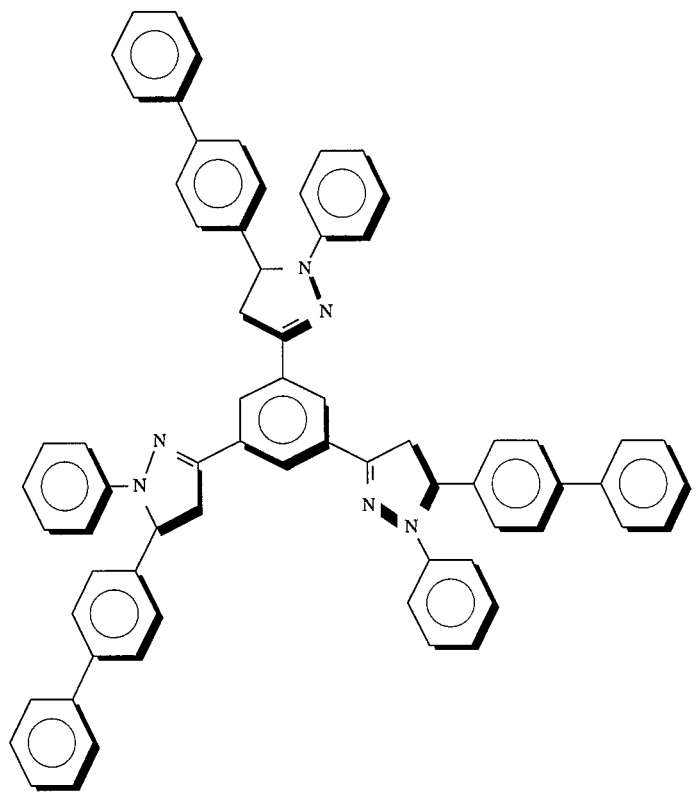
[Chemical Formula 24]
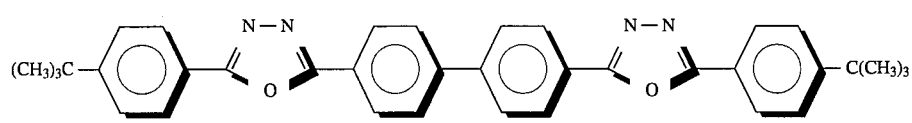
[Chemical Formula 25]
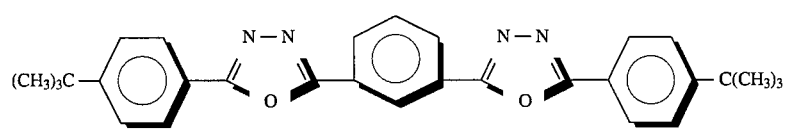

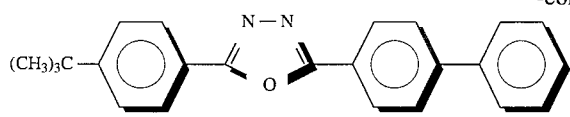

Also, the dopant doping the organic luminous layer and/or organic electron transport layer may be any of the dopants described in the above examples. The dopant for the organic luminous layer may be selected from Alq3, rubrene, DCM, decacyclene, NK-757, naphthacene, and DPA to have the minimum level of the conducting band lower than that of the material forming the organic luminous layer (preferably lower than that of the material forming the organic electron transport layer). Similarly, the dopant doping the organic electron transport layer may be selected from Alq3, rubrene, DCM, decacyclene, NK-757, naphthacene, and DPA to have the maximum level of the valence band higher than that of the material forming the organic electron transport layer (preferably higher than that of the material forming the organic luminous layer).

The same effects can be also obtained in the DH structure. Although, the DH-structure organic EL element has two boundaries between the organic hole transport layer and organic luminous layer, the organic electron transport layer and organic luminous layer, the electrons and holes re-combine collectively at either boundary to luminesce. Accordingly, the charges accumulate in the boundary where most of the electrons and holes re-combine, or where the luminescing occurs. Thus, it is understood that doping the luminescing boundary is most effective in this case.

Doping the boundary between the organic hole transport layer and organic luminous layer can be done in the same manner as the SH-A structure, and doping the boundary between the organic electron transport layer and organic luminous layer can be done in the same manner as the SH-B structure.

Although the organic carrier transport layer and the organic luminous layer are made of a single material, they can be made of a mixture of organic materials to obtain the same effects.

Although the present invention has been fully described by way of example with reference to the accompanying drawings, it is to be noted that various changes and modifications will be apparent to those skilled in the art. Therefore, unless otherwise such changes and modifications depart from the scope of the present invention, they should be construed as being included therein.

What is claimed is:

1. An organic EL element comprising a pair of a hole injecting electrode and an electron injecting electrode sandwiching an organic luminous layer and an organic carrier transport layer placed one on top of the other to have a boundary between the organic luminous layer and the organic carrier transport layer, wherein one of the organic luminous layer and the organic carrier transport layer, whichever is placed closer to the hole injecting electrode, is doped with a first organic material, the first organic material being made of at least one substance, a minimum level of a conducting band of the first organic material being lower than a minimum level of a conducting band of the layer which is doped with the first organic material.

2. The organic EL element of claim 1, wherein the doped area of the organic carrier transport layer or the organic luminous layer is in contact with the boundary.

3. The organic EL element of claim 2, wherein the minimum level of the conducting band of the first organic material is equal to or lower than a minimum level of the conducting band of one of the organic luminous layer and the organic carrier transport layer, whichever has a lower minimum level of the conducting band.

4. The organic EL element of claim 2, wherein the first organic material is selected from a group consisting of rubrene, tris(8-hydroxyquinoline)aluminum, 4-(dicyanomethylene)-2-methyl-6-(4-dimethylaminostyryl)-4H-pyran, decacyclene, 1-ethyl-2-[(1-ethyl-2(1H )-quinolylidene)methyl]quinolinium iodide, naphthacene, 9,10-diphenylanthracene, which are expressed as Chemical Formulas 101, 102, 103, 104, 105, 106, and 107, respectively

[Chemical Formula 26]

[Chemical Formula 101]

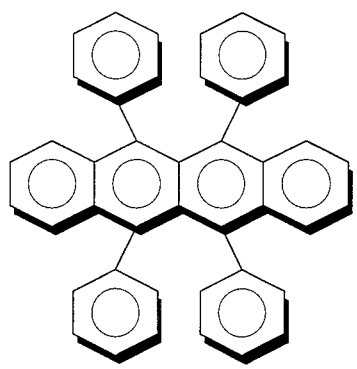

-continued

[Chemical Formula 102]

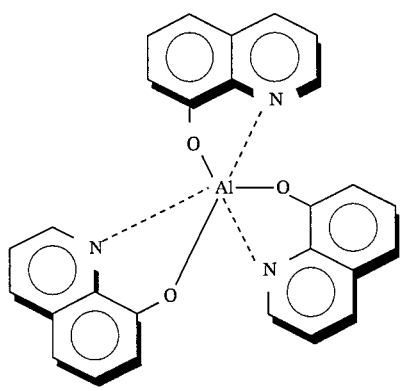

[Chemical Formula 103]

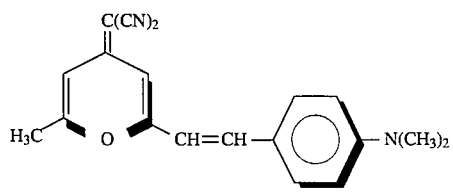

[Chemical Formula 104]

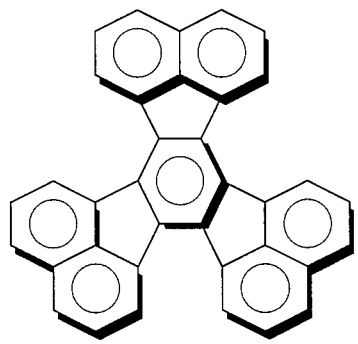

[Chemical Formula 105]

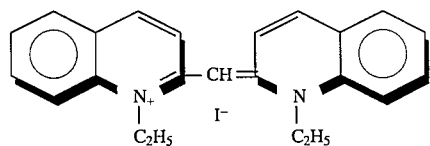

[Chemical Formula 106]

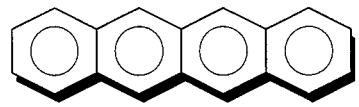

[Chemical Formula 107]

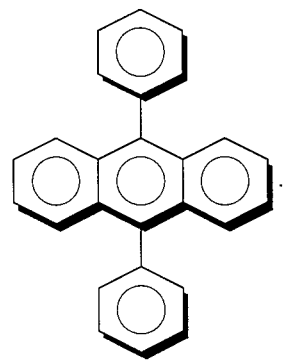

5. The organic EL element of claim 2, wherein the organic carrier transport layer is an organic hole transport layer, whereby the hole injecting electrode, organic hole transport layer, organic luminous layer, and electron injecting electrode are sequentially layered to form the organic EL element.

6. The organic EL element of claim 5, wherein the first organic material includes a fluorescent material, and a maximum level of a valence band of the fluorescent material is equal to or higher than a maximum level of a valence band of the organic hole transport layer.

7. The organic EL element of claim 5, wherein the first organic material is selected from a group consisting of rubrene, tris(8-hydroxyquinoline)aluminum, 4-(dicyanomethylene)-2-methyl-6-(4-dimethylaminostyryl)-4H-pyran, decacyclene, 1-ethyl-2-[(1-ethyl-2(1H)-quinolylidene)methyl]quinolinium iodide, naphthacene, 9,10-diphenylanthracene, which are expressed as Chemical Formulas 108, 109, 110, 111, 112, 113, and 114, respectively

[Chemical Formula 108]

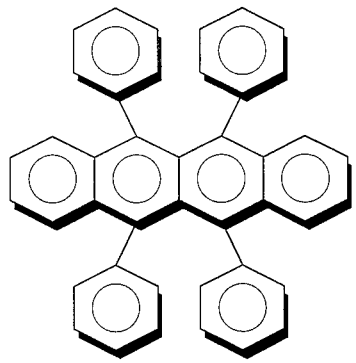

[Chemical Formula 109]

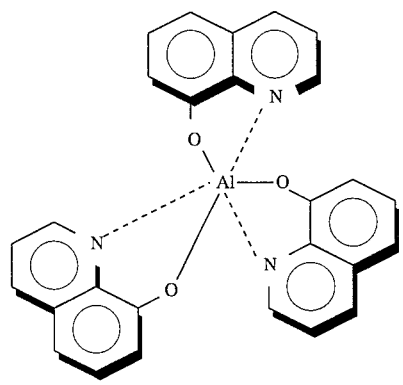

[Chemical Formula 110]

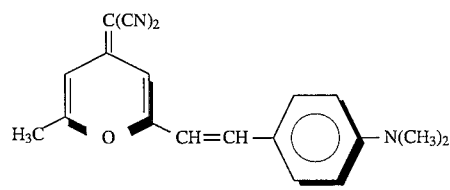

[Chemical Formula 111]

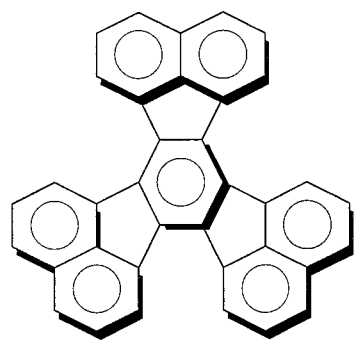

[Chemical Formula 112]

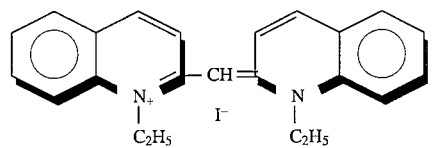

[Chemical Formula 113]

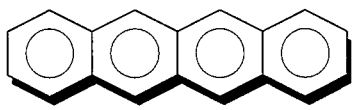

[Chemical Formula 114]

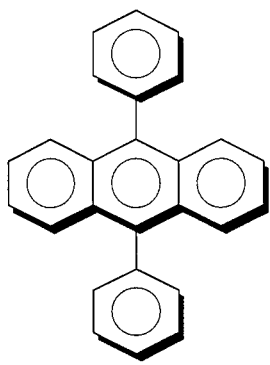

8. The organic EL element of claim 2, wherein the organic carrier transport layer is an organic electron transport layer, whereby the hole injecting electrode, organic luminous layer, organic electron transport layer, and electron injecting electrode are layered to form the organic EL element.

9. The organic EL element of claim 8, wherein the first organic material is selected from a group consisting of rubrene, tris(8-hydroxyquinoline)aluminum, 4-(dicyanomethylene)-2-methyl-6-(4-dimethylaminostyryl)-4H-pyran, decacyclene, 1-ethyl-2-[(1-ethyl-2(1H)-quinolylidene)methyl]quinolinium iodide, naphthacene, 9,10-diphenylanthracene, which are expressed as Chemical Formulas 115, 116, 117, 118, 119, 120, and 121, respectively

[Chemical Formula 115]

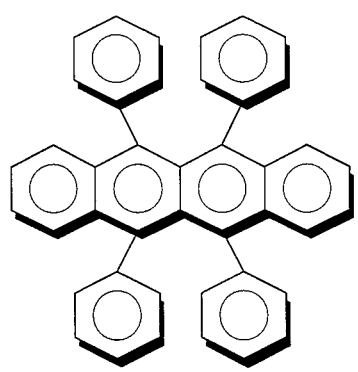

[Chemical Formula 116]

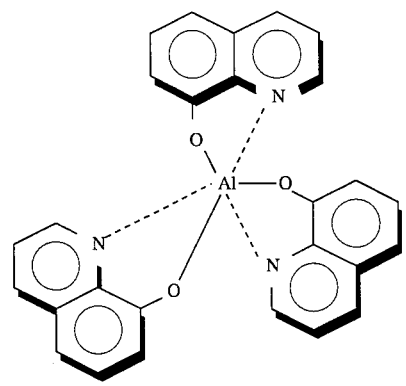

[Chemical Formula 117]

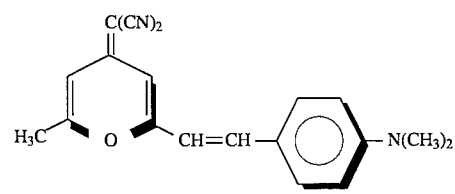

[Chemical Formula 118]

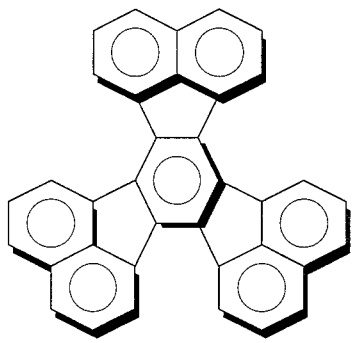

[Chemical Formula 119]

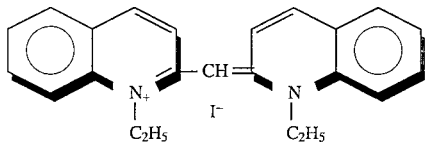

[Chemical Formula 120]

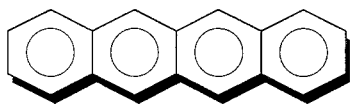

[Chemical Formula 121]

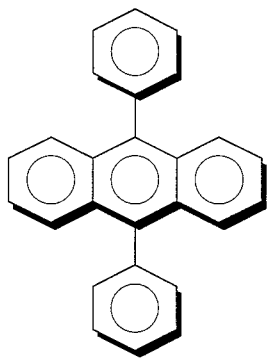

10. The organic EL element of claim 1, wherein one of the organic luminous layer and the organic carrier transport layer, whichever is placed closer to the electron injecting electrode, is doped with a second organic material, the second organic material being made of at least one substance, a maximum level of a valence band of the second organic material being higher than a maximum level of a valence band of the layer which is doped with the second organic material.

11. An organic EL element comprising a hole injecting electrode, an organic hole transport layer, an organic luminous layer, an organic electron transport layer, and an electron injecting electrode, the organic luminous layer being in contact with the organic hole transport layer to form a first boundary, the organic electron transport layer being in contact with the organic luminous layer to form a second boundary, wherein:

an area where the organic hole transport layer is in contact with the first boundary is doped with a first organic material, the first organic material being made of at least one substance, a minimum level of a conducting band of the first organic material being lower than a minimum level of a conducting band of the organic hole transport layer.

12. The organic EL element of claim 11, wherein the first organic material is selected from a group consisting of rubrene, tris(8-hydroxyquinoline)aluminum, 4-(dicyanomethylene)-2-methyl-6-(4-dimethylaminostyryl)-4H-pyran, decacyclene, 1-ethyl-2-[(1-ethyl-2(1H)-quinolylidene )methyl]quinolinium iodide, naphthacene, 9,10-diphenylanthracene, which are expressed as Chemical Formulas 122, 123, 124, 125, 126, 127, and 128, respectively

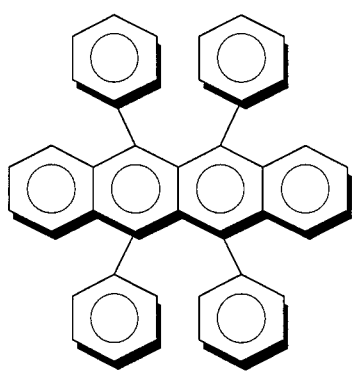
[Chemical Formula 122]
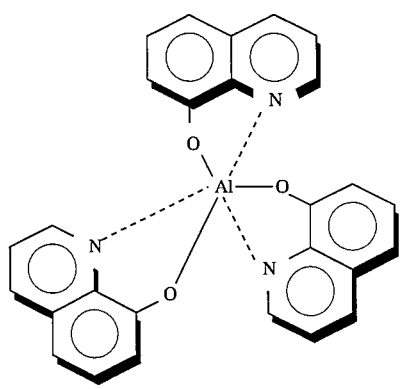
[Chemical Formula 123]
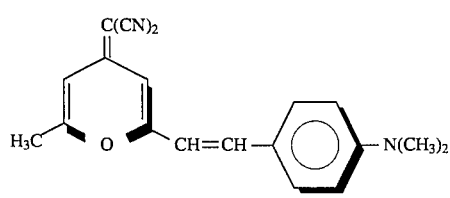
[Chemical Formula 124]
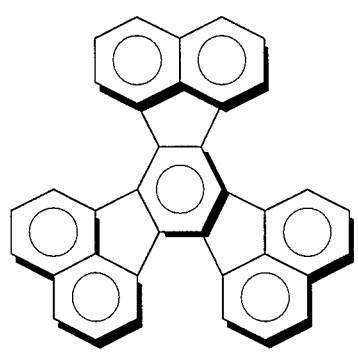
[Chemical Formula 125]
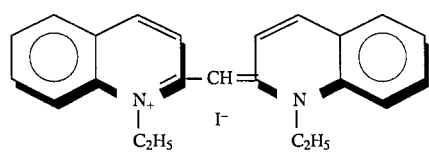
[Chemical Formula 126]
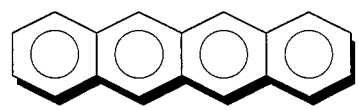
[Chemical Formula 127]

-continued

[Chemical Formula 128]

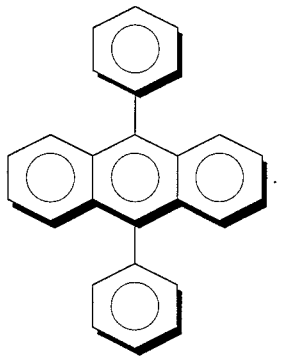

13. The organic EL element of claim 11, wherein an area where the organic luminous layer is in contact with the first boundary is doped with a second organic material, the second organic material being made of at least one substance, a maximum level of a valence band of the second organic material being higher than a maximum level of a valence band of the organic luminous layer.

14. The organic EL element of claim 11, wherein an area where the organic electron transport layer is in contact with the second boundary is doped with a second organic material, the second organic material being made of at least one substance, a maximum level of a valence band of the second organic material being higher than a maximum level of a valence band of the organic electron transport layer.

* * * * *